(12) United States Patent
Liu et al.

(10) Patent No.: US 12,442,493 B2
(45) Date of Patent: Oct. 14, 2025

(54) LIGHT EMITTING PANEL, PREPARATION METHOD THEREOF, AND LIGHT EMITTING APPARATUS

(71) Applicants: HEFEI BOE RUISHENG TECHNOLOGY CO., LTD., Anhui (CN); BOE Technology Group Co., Ltd., Beijing (CN)

(72) Inventors: Xing Liu, Beijing (CN); Hai Tang, Beijing (CN); Xiaolin Geng, Beijing (CN); Xiao Wang, Beijing (CN); Liang Gao, Beijing (CN); Haoyu Zhou, Beijing (CN)

(73) Assignees: HEFEI BOE RUISHENG TECHNOLOGY CO., LTD., Anhui (CN); BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 0 days.

(21) Appl. No.: 18/274,482

(22) PCT Filed: Jul. 8, 2022

(86) PCT No.: PCT/CN2022/104709
§ 371 (c)(1),
(2) Date: Jul. 27, 2023

(87) PCT Pub. No.: WO2024/007324
PCT Pub. Date: Jan. 11, 2024

(65) Prior Publication Data
US 2025/0043927 A1 Feb. 6, 2025

(51) Int. Cl.
*F21K 9/68* (2016.01)
*F21K 9/90* (2016.01)
(Continued)

(52) U.S. Cl.
CPC ............. *F21K 9/68* (2016.08); *F21K 9/90* (2013.01); *F21Y 2105/16* (2016.08); *F21Y 2115/10* (2016.08)

(58) Field of Classification Search
CPC .......... F21K 9/68; F21K 9/90; F21Y 2105/16; F21Y 2115/10
See application file for complete search history.

(56) References Cited

U.S. PATENT DOCUMENTS

| | | | |
|---|---|---|---|
| 2011/0157186 A1 | 6/2011 | Funk et al. | |
| 2011/0292655 A1* | 12/2011 | Ing | G09F 13/14 362/241 |

(Continued)

FOREIGN PATENT DOCUMENTS

| | | | |
|---|---|---|---|
| CN | 110556468 A | 12/2019 | |
| CN | 112786765 A | 5/2021 | |

(Continued)

*Primary Examiner* — Elmito Breval
(74) *Attorney, Agent, or Firm* — WHDA, LLP

(57) ABSTRACT

The present application provides a light emitting panel, a preparation method thereof, and a light emitting apparatus, which relate to the field of display technology. The light emitting panel includes a base; a reflective layer located on a side of the base, the reflective layer includes a plurality of grooves arranged in an array; a plurality of devices located in the grooves and electrically connected to the base; a first optical film located on a side of the reflective layer facing away from the base, the orthographic projection of the first optical film on the base covers the orthographic projection of the reflective layer on the base, and at least partial areas of the reflective layer are in direct contact with the first optical film.

13 Claims, 5 Drawing Sheets

(51) Int. Cl.
   *F21Y 105/16*     (2016.01)
   *F21Y 115/10*     (2016.01)

(56) References Cited

U.S. PATENT DOCUMENTS

| | | |
|---|---|---|
| 2013/0148035 A1* | 6/2013 | Shimizu ............ G02F 1/133605 |
| | | 348/739 |
| 2020/0105966 A1* | 4/2020 | Sasaoka ............... H10H 20/813 |
| 2022/0236609 A1 | 7/2022 | Zhang et al. |
| 2022/0246671 A1 | 8/2022 | Sun et al. |

FOREIGN PATENT DOCUMENTS

| | | |
|---|---|---|
| CN | 113281937 A | 8/2021 |
| TW | I760086 B | 4/2022 |

* cited by examiner

LIGHT EMITTING PANEL, PREPARATION METHOD THEREOF, AND LIGHT EMITTING APPARATUS

TECHNICAL FIELD

The present application relates to the field of display technology, in particular to a light emitting panel, a preparation method thereof, and a light emitting apparatus.

BACKGROUND

With the rapid development of display technology, display products including Mini Light Emitting Diodes (Mini LED) and Micro Light Emitting Diodes (Micro LED) have attracted widespread attention. For display products including Mini/Micro LEDs, the light utilization rate is an important indicator to measure the performance thereof. Therefore, it is particularly important to improve the light utilization rate of this type of display products.

SUMMARY

Embodiments of the present application adopt technical solutions described below.

In a first aspect, an embodiment of the present application provides a light emitting panel, including:
  a base;
  a reflective layer located on a side of the base, and the reflective layer includes a plurality of grooves arranged in an array;
  a plurality of devices located in the grooves and electrically connected to the base; and
  a first optical film located on a side of the reflective layer facing away from the base, an orthographic projection of the first optical film on the base covers an orthographic projection of the reflective layer on the base, and at least partial areas of the reflective layer are in direct contact with the first optical film.

In some embodiments, orthographic projections of outer contours of every two adjacent grooves on the base are not connected to each other.

In some embodiments, each of the grooves includes a bottom close to the base and an opening close to the first optical film; an orthographic projection of an outer contour of the bottom on the base is located within an orthographic projection of an outer contour of the opening on the base, and an orthographic projection of an outer contour of the device on the base is located within the orthographic projection of the outer contour of the bottom on the base.

In some embodiments, the reflective layer includes groove arrangement areas and a connection area between two adjacent groove arrangement areas, and the groove is located in the groove arrangement area; a part of the reflective layer located in the groove arrangement area comprises at least one sub-layer, and a part of the reflective layer located in the connection area comprises at least one sub-layer, a number of sub-layers of the part of the reflective layer located in the groove arrangement area is greater than or equal to a number of sub-layers of the part of the reflective layer located in the connection area.

In some embodiments, a thickness of the part of the reflective layer located in the groove arrangement area in a direction perpendicular to a plane where the base is located is greater than or equal to a thickness of the part of the reflective layer located in the connection area in the direction perpendicular to the plane where the base is located.

In some embodiments, the first optical film is at least in direct contact with the part of the reflective layer located in the groove arrangement area.

In some embodiments, the thickness of the part of the reflective layer located in the groove arrangement area in the direction perpendicular to the plane where the base is located is equal to the thickness of the part of the reflective layer located in the connection area in the direction perpendicular to the plane where the base is located; the first optical film is in direct contact with both of the part of the reflective layer located in the groove arrangement area and the part of the reflective layer located in the connection area.

In some embodiments, the thickness of the part of the reflective layer located in the groove arrangement area in the direction perpendicular to the plane where the base is located is greater than the thickness of the part of the reflective layer located in the connection area in the direction perpendicular to the plane where the base is located; the first optical film is in direct contact with the part of the reflective layer located in the groove arrangement area, and a gap exists between the first optical film and the part of the reflective layer located in the connection area.

In some embodiments, the part of the reflective layer located in the groove arrangement area comprises the groove and a supporting portion surrounding the groove, and the part of the reflective layer located in the connection area comprises a connection portion; the supporting portion is configured to support the first optical film, a sidewall of the groove is configured to reflect and converge light emitted by the device, and the connection portion is configured to reflect the light into the first optical film.

In some embodiments, an outer contour of the orthographic projection of the supporting portion on the base is connected to an outer contour of the orthographic projection of the connection portion on the base; or the orthographic projection of the supporting portion on the base covers a partial area of the orthographic projection of the connection portion on the base.

In some embodiments, the light emitting panel includes at least one light extraction structure, the light extraction structure is located in the groove and covers the device, and a gap exists between the light extraction structure and the first optical film.

In some embodiments, the sidewall of the groove includes a flat surface, an arc surface or a combination of the flat surface and the arc surface.

In some embodiments, a material of the supporting portion includes a photo-curable material with a reflective function, and the material of the connection portion comprises one of the photo-curable material with the reflective function, a reflective sheet, white ink, and silicon-based white glue.

In a second aspect, an embodiment of the present application provides a light emitting device, including the light emitting panel as described in the first aspect.

In a third aspect, an embodiment of the present application provides a method for preparing a light emitting panel as described in the first aspect, the method including:
  providing a base;
  electrically connecting the plurality of devices to the base;
  forming a reflective layer with a plurality of grooves arranged in an array, the devices being located in the grooves;
  fixing a first optical film on the reflective layer, wherein an orthographic projection of the first optical film on the base covers an orthographic projection of the reflective layer on the base, and at least partial areas of the reflective layer are in direct contact with the first optical film.

In some embodiments, the reflective layer includes a supporting portion and a connection portion; forming a reflective layer with a plurality of grooves arranged in an array, the devices being located in the grooves includes:

forming the supporting portion and the groove simultaneously through a printing process, the supporting portion surrounds the groove and is in direct contact with the first optical film;

forming the connection portion; an outer contour of the orthographic projection of the supporting portion on the base is connected to an outer contour of the orthographic projection of the connection portion on the base; or, the orthographic projection of the supporting portion on the base covers a partial area of the orthographic projection of the connection portion on the base.

The above-mentioned description is merely an overview of the technical solutions of the present disclosure. In order to know about the technical means of the present disclosure more clearly so that the solutions according to the contents of the specification may be implemented, and in order to make the above-mentioned and other objects, features and advantages of the present disclosure more apparent and understandable, specific implementations of the present disclosure are set forth below.

BRIEF DESCRIPTION OF THE DRAWINGS

In order to describe the embodiments of the present disclosure or the technical solutions in the related art more clearly, the accompanying drawings which are used in the description of the embodiments or the related art will be briefly introduced. Apparently, the accompanying drawings in the following description illustrate merely some embodiments of the present disclosure, and those skilled in the art may obtain other accompanying drawings based on these accompanying drawings without paying any creative effort.

DETAILED DESCRIPTION OF THE EMBODIMENTS

Figure 1:
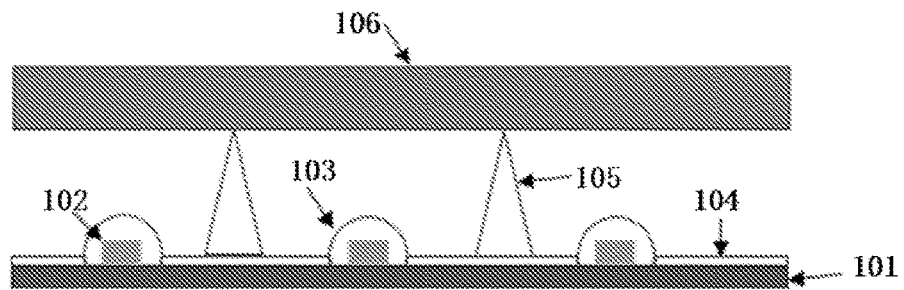
FIG. 1 is a schematic structural diagram of a light emitting panel in the related art.

A clear and thorough description for technical solutions in the embodiments of the present disclosure will be given below in conjunction with the accompanying drawings in the embodiments of the present disclosure. Apparently, the described embodiments are a part of embodiments of the present disclosure, not all the embodiments. All other embodiments obtained, based on the embodiments in the present disclosure, by those skilled in the art without paying creative effort fall within the protection scope of the present disclosure.

In the drawings, the thicknesses of regions and layers may be exaggerated for clarity. Same or similar structures are marked with same reference numerals, and thus the detailed descriptions thereof will be omitted. Furthermore, the drawings are merely schematic illustrations of the present disclosure and are not necessarily drawn to scale.

In the embodiments of the present application, unless otherwise specified, "plurality" means two or more. The orientation or positional relationship indicated by the term "on" is based on the orientation or positional relationship shown in the drawings, and is only for the convenience of describing the present application and simplifying the description, rather than indicating or implying that the structure or element referred to must have a specific orientation, be constructed and operated in a specific orientation, and therefore cannot be construed as a limitation on the present application.

Unless it is required in the context, otherwise, the terms "comprising" throughout the specification and claims are interpreted in an open and inclusive sense, i.e., "including, but not limited to". In the description of the specification, the terms "one embodiment", "some embodiments", "exemplary embodiment", "example", "specific example" or "some examples" are intended to indicate that specific features, structures, materials or characteristics related to the embodiment or examples are included in at least one embodiment or example of the present application. Schematic representations of the above terms are not necessarily referring to the same embodiment or example. Furthermore, the particular features, structures, materials or characteristics may be included in any suitable manner in any one or more embodiments or examples.

In the embodiments of the present application, wordings such as "first" and "second" are used to distinguish the same or similar items with basically the same function and effect, and are only used for clearly describing the technical solutions of the embodiments of the present application, and cannot be understood as indicating or implying relative importance or implicitly indicating the number of indicated technical features.

In the related art, in order to improve the light utilization rate of display products including Mini Light Emitting Diodes (Mini LED) and Micro Light Emitting Diodes (Micro LED), as shown in FIG. 1, a reflective layer 104 such as a white ink layer is prepared on an area of the base 101 where no device 102 is provided, and a lens structure 103 is prepared on the device 102, so as to improve the light extraction efficiency. A part of the light emitted by the device 102 can directly enter the diffusion film 106 and exit, and another part of the light emitted by the device 102 is reflected by the diffusion film 106 to the reflective layer 104, reflected by the reflective layer 104, and then enters the diffusion film 106 again. Through such solution, the light utilization rate can be increased in a limited degree. In order to greatly increase the light utilization efficiency, researchers have put a lot of effort into reflectivity parameters of the reflective layer 104, and the light utilization efficiency is further improved by increasing the reflectivity of the reflective layer 104 as much as possible. However, most of the improvement solutions in the related art ignore the loss of light, in the space between the reflective layer 104 and the diffusion film 106, that is reflected by the reflective layer 104 and does not enter the diffusion film 106.

Figure 2:
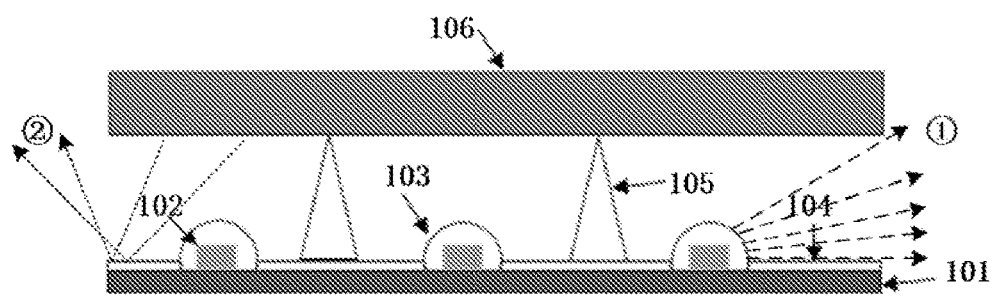
FIG. 2 is a schematic diagram illustrating an optical path in FIG. 1.

As shown in FIG. 2, in the display products of the related art, a part of the light emitted by the devices 102 (for example, the light marked as ① in FIG. 2) cannot enter the diffusion film 106 at the beginning, thereby causing the first light loss. The first light loss of each of the devices 102 is different. The closer the device 102 to the edge of the diffusion film 106, the greater the first light loss. In addition, another part of the light emitted by the device 102 (for example, the light marked as ② in FIG. 2) is reflected back to the reflective layer 104 by the diffusion film 106. After being reflected by the reflective layer 104, this part of the light does not enter the diffusion film 106 again, resulting in a second light loss. The closer to the edge position of the reflective layer 104, the higher the occurrence rate of the second light loss.

In view of this, an embodiment of the present application provides a light emitting panel, as shown in FIG. 3 to FIG. 8, the light emitting panel includes:
a base 201;
a reflective layer 203 located on a side of the base 201, the reflective layer 203 including a plurality of grooves C arranged in an array;
a plurality of devices 202 located in the grooves C and electrically connected to the base 201; and
a first optical film 204 located on a side of the reflective layer 203 facing away from the base 201, an orthographic projection of the first optical film 204 on the base 201 covering the orthographic projection of the reflective layer 203 on the base 201, and at least partial region of the reflective layer 203 being in direct contact with the first optical film 204.

The specific structure of the base 201 is not limited here.

Exemplarily, the base 201 may include a substrate and a conductive pattern on the substrate. The conductive pattern is configured to form connection traces and a driving circuit. Each device 202 is electrically connected to the driving circuit in the base 201.

In some embodiments, the material of the substrate may be any one of glass, silicon, quartz, and Polyethylene terephthalate (PET). The thickness of the substrate may range from 0.2 mm to 1 mm. For example, the thickness of the substrate is 0.2 mm, 0.4 mm, 0.5 mm, 0.7 mm or 1 mm.

Since the light emitted by the light emitting device radiates to the surroundings, the reflective layer 203 can reflect the light emitted by the light emitting device to the light-emitting-surface of the light emitting panel, so as to improve the light utilization efficiency of the light emitting device.

In some embodiments, the color of the reflective layer 203 is white, so that the reflective layer 203 has a higher reflectivity.

Exemplarily, the material of the reflective layer 203 may include white ink, and the components of the white ink include resin (for example, epoxy resin, polytetrafluoroethylene resin), titanium dioxide (chemical formula $TiO_2$), and organic solvent (for example, dipropylene glycol methyl ether) and the like.

Exemplarily, the material of the reflective layer 203 may also include silicon-based white glue.

Exemplarily, the material of the reflective layer 203 may also include a reflector sheet.

Exemplarily, the material of the reflective layer 203 may include a photo-curable resin.

In some embodiments, the reflective layer 203 may also be fabricated on the base 201 through processes of sputtering, film plating, coating and the like. Alternatively, in some other embodiments, the reflective layer 203 can be fabricated on the base 201 through a printing process.

The shape of the orthographic projection of the groove C on the base 201 is not limited herein. Exemplarily, the shape of the orthographic projection of the outer contour of the groove C on the base 201 may be a circle, an ellipse or a polygon; the shape of the orthographic projection of the inner contour of the groove C on the base 201 may be a circle, an ellipse or a polygon.

Figure 3:
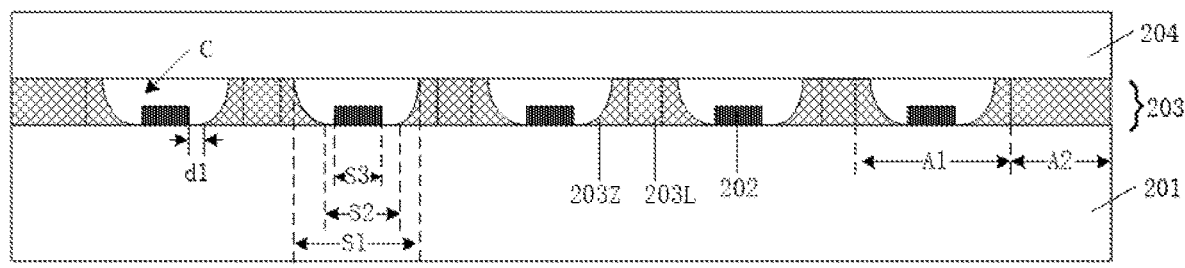
FIG. 3 is a structural schematic diagram illustrating a light emitting panels provided by an embodiment of the present application.
Figure 4:
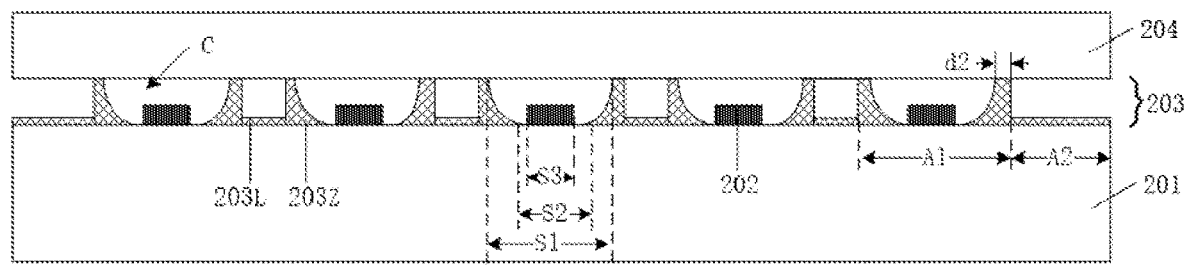
FIG. 4 is a structural schematic diagram illustrating a light emitting panels provided by another embodiment of the present application.
Figure 6:
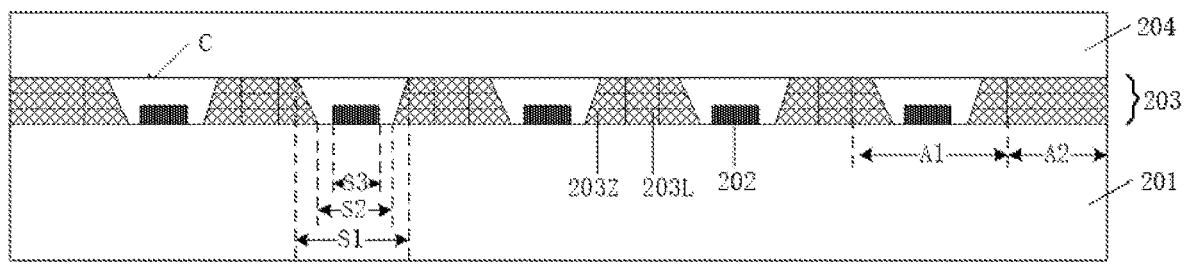
FIG. 6 is a structural schematic diagram illustrating a light emitting panels provided by another embodiment of the present application.

Herein, there is no limitation on the cross sectional shape of the groove C in a direction perpendicular to a plane where the base 201 is located. Exemplarily, as shown in FIG. 3 and FIG. 4, the cross-sectional shape of the groove C in the direction perpendicular to the plane where the base 201 is located includes a semicircle or a semiellipse. Alternatively, as shown in FIG. 6, the cross-sectional shape of the groove C along the direction perpendicular to the plane where the base 201 is located includes a trapezoid.

It should be noted that, in the embodiment of the present application, the direction perpendicular to the plane where the base 201 is located refers to a direction in the thickness of the base 201, and the relevant descriptions below have the same meaning as here, and will not be repeated here.

Herein, there is no limitation on the size of the groove C in a direction parallel to the plane where the base 201 is located, which can be determined according to the size of the device 202 and the external force that the reflective layer 203 needs to bear.

It should be noted that, the description related to "the plane where the base 201 is located" in the embodiments of the present application means that the base 201 of the three-dimensional structure is deemed as a thin, approximately planar structure, which is used as a reference to describe other structures.

In an exemplary embodiment, the devices 202 include at least a light emitting device, and may also include any one of a sensor device, a micro-drive chip or other types of devices. It can be understood that the number of various types of devices is different, or the density of the array arrangement of different types of devices is different.

The light emitting device may be a Mini Light Emitting Diode (English abbreviation is Mini LED) or a micro light emitting diode (English abbreviation is Micro LED), which is not limited herein.

Exemplarily, the devices 202 may all be Mini LEDs or micro-LEDs emitting blue light, or the devices 202 may include three types of LEDs or micro LEDs emitting red light, green light and blue light.

In some embodiments, in order to prevent the device 202 from being affected by the sidewall of the groove C, for example, avoiding a negative impact, caused by the sidewall of the groove C, on the light emitted by the light emitting device, the device 202 is located in the groove C with a gap existing between the device 202 and the sidewall of the groove C, so that the light emitted by the light emitting device is not blocked by the sidewall of the groove C and can be normally emitted out.

As shown in FIG. 3, the dimension d1 of the gap between the device 202 and the sidewall of the groove C is not limited here, and may be determined according to a product design.

In an exemplary embodiment, when the above light emitting panel is used in a backlight apparatus, the first optical film 204 may include a diffusion plate; when the above light emitting panel is used in a display apparatus, the first optical film 204 may include a non-opaque protective layer or a non-opaque flat layer.

In an exemplary embodiment, other film layers may also be provided on a side of the first optical film 204 facing away from the base 201, which may be determined according to the design of the product.

The orthographic projection of the first optical film 204 on the base 201 covers the orthographic projection of the reflective layer 203 on the base 201 in a situation including but not limited to:

in a first situation, an outer contour of the orthographic projection of the reflective layer 203 on the base 201 is located within an outer contour of the orthographic projection of the first optical film 204 on the base 201; in this case, the area of the orthographic projection of the first optical film 204 on the base 201 is greater than the area of the orthographic projection of the reflective layer 203 on the base 201;

in a second situation, the outer contour of the orthographic projection of the reflective layer 203 on the base 201 overlaps with the outer contour of the orthographic projection of the first optical film 204 on the base 201; in this case, the area of the orthographic projection of the first optical film 204 on the base 201 is equal to the area of the orthographic projection of the reflective layer 203 on the base 201.

In an exemplary embodiment, at least partial region of the reflective layer 203 is in direct contact with the first optical film 204 in a situation including but not limited to:

in a first situation, a partial area of the reflective layer 203 is in direct contact with the first optical film 204;

in a second situation, the entire reflective layer 203 is in direct contact with the first optical film 204.

It should be noted that since the reflective layer 203 includes a plurality of grooves C arranged in an array, the partial region of the reflective layer 203 being in direct contact with the first optical film 204 means that partial regions other than the grooves C in the reflective layer 203 are in direct contact with the first optical film 204; the entire reflective layer 203 being in direct contact with the first optical film 204 means that all regions other than the grooves C in the reflective layer 203 are in direct contact with the first optical film 204.

In the embodiment of the present application, on the one hand, the reflective layer 203 can reflect light, and on the other hand, the reflective layer 203 can also support the first optical film 204.

It should be noted that the above light emitting panel may be a backlight panel. Alternatively, the above light emitting panel may also be a display panel.

In the embodiment of the present application, the reflective layer 203 is provided with a plurality of grooves C arranged in an array, and the device 202 is arranged in the groove C, due to the reflection effect of the side wall of the groove C, it is possible to avoid the first light loss in the related art caused by the part of the light marked as ① in FIG. 2 because this part of light cannot be injected into the first optical film 204. Further, since at least partial regions of the reflective layer 203 provided by the embodiment of the present application are in direct contact with the first optical film 204, the situation in the related art that the part of the light marked as ② in FIG. 2 is reflected to the reflective layer 104 by the diffusion layer 106, reflected by the reflective layer 104 and fails to enter the diffusion film 106 is avoided, that is, the second light loss is significantly reduced. In this way, the light emitting panel provided by the embodiments of the present application can significantly reduce the light loss during the propagation of light, thereby improving the utilization rate of light.

In addition, since at least partial regions of the reflective layer 203 provided by the embodiment of the present application are in direct contact with the first optical film 204, the first optical film 204 and other film layers on the first optical film 204 can be supported, and a certain optical distance is provided to eliminate lamp shadows. Moreover, the design of a support column 105 as shown in FIG. 2 in the related art can also be omitted, reducing the preparation cost.

In some embodiments of the present application, as shown in FIG. 3 to FIG. 8, the orthographic projections of the outer contours of every two adjacent grooves C on the base 201 are not connected to each other.

The orthographic projections of the outer contours of every two adjacent grooves C on the substrate 201 being "not connected" means that, in a direction parallel to the base 201, the minimum distance between every two adjacent grooves C is greater than zero.

No limitation is made on the specific value of the minimum distance between every two adjacent grooves C in the direction parallel to the base 201 herein, which may be determined according to the design of the product.

In some embodiments of the present application, the size of the groove C can be reduced as much as possible, with the device 202 being received inside the groove C and the sidewall of the groove C being not in contact with the device 202. In this way, on the one hand, the area of the reflective layer 203 located between two adjacent grooves C is increased, and the supporting effect of the reflective layer 203 on the first optical film 204 is improved. On the other hand, since the sidewall of the groove C reflects light, the smaller the size of the groove C, the smaller the light loss; moreover, due to the reflection of the light by the sidewall of the groove C, the light convergence capability of the groove C is improved, so that more light can be directly injected into the first optical film 204 after being reflected by the sidewall of the groove C, reducing the probability of light entering the reflective layer 203.

In some embodiments of the present application, as shown in FIG. 3 to FIG. 8, and FIGS. 9, 10, the groove C includes a bottom Cd on a side close to the base 201 and an opening Ck on a side close to the first optical film 204.

The orthographic projection S2 of the outer contour of the bottom Cd on the base 201 is located within the orthographic projection S1 of the outer contour of the opening Ck on the base 201, and the orthographic projection S3 of the outer contour of the device 202 on the base 201 is located within the orthographic projection S2 of the outer contour of the bottom Cd on the base 201.

In an exemplary embodiment, the orthographic projection S2 of the outer contour of the bottom Cd on the base 201 being located within the orthographic projection S1 of the outer contour of the opening Ck on the base 201 means that an area delineated by the orthographic projection S2 of the outer contour of the bottom Cd on the base 201 is located within an area delineated by the orthographic projection S1 of the outer contour of the opening Ck on the base 201. Accordingly, the size of the opening Ck of the groove C is greater than the size of the bottom Cd, which is conductive to the emission of light emitted by the device 202 located on the bottom Cd of the groove C, thereby further improving the light extraction efficiency and the utilization rate of light.

In some embodiments, the orthographic projection S2 of the outer contour of the bottom Cd on the base 201 may overlap with the orthographic projection S1 of the outer contour of the opening Ck on the base 201. Accordingly, the structural design is relatively simple while the light extraction efficiency is improved, thus the preparation process is less difficult, and the cost is low. However, by comparison, in the case that the area delineated by the orthographic projection S2 of the outer contour of the bottom Cd on the base 201 is located within the area delineated by the orthographic projection S1 of the outer contour of the opening Ck on the base 201, the light extraction efficiency is higher. In practical applications, a comprehensive consideration may be made according to the product's requirements for light efficiency and cost.

Herein, the shape of the orthographic projection of the outer contour of the bottom Cd/the opening Ck of the groove C on the base 201 is not limited.

Figure 9:
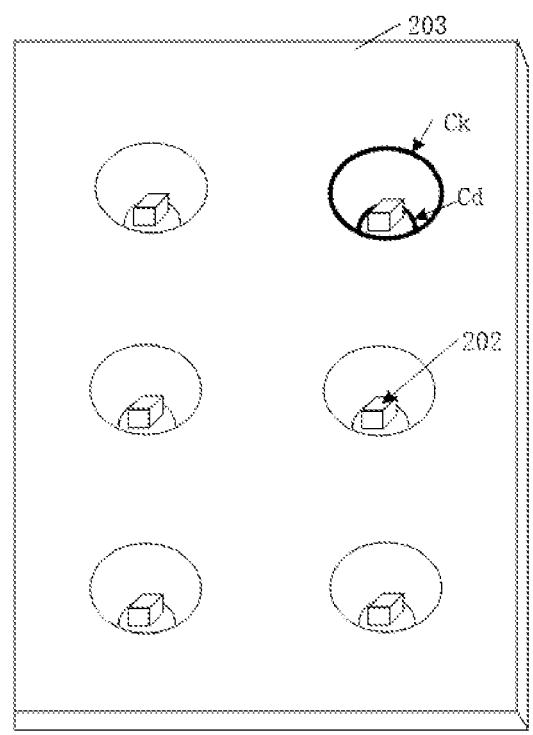
FIG. 9 is a top view structural view illustrating a reflective layer provided by an embodiment of the present application.

Exemplarily, as shown in FIG. 9, the shape of the orthographic projection of the outer contour of the bottom Cd of the groove C on the base 201 and the shape of the orthographic projection of the outer contour of the opening Ck of the groove C on the base 201 are both a circle or an ellipse, and the shapes of them are the same.

Figure 10:
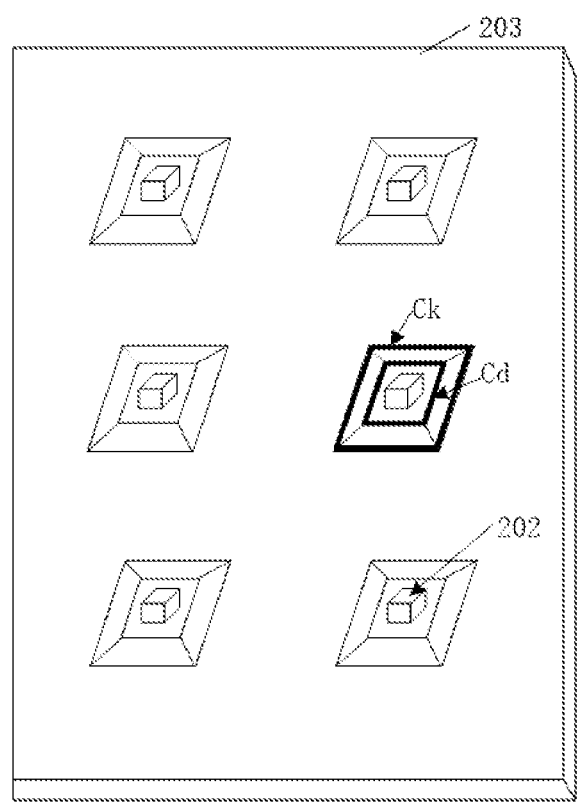
FIG. 10 is a top view structural view illustrating a reflective layer provided by another embodiment of the present application.

Exemplarily, as shown in FIG. 10, the shape of the orthographic projection of the outer contour of the bottom Cd of the groove C on the base 201 and the shape of the orthographic projection of the outer contour of the opening Ck of the groove C on the base 201 are both a quadrangle, and the shapes of them are the same.

The specific configuration of the sidewall of the groove C is not limited here. In some embodiments, the sidewall of the groove C may all be an arc surface. In some other embodiments, the sidewall of the groove C may all be flat surfaces. In yet other embodiments, the sidewall of the groove C may include a combination of two arc surfaces and two flat surfaces.

In some embodiments of the present application, as shown in FIG. 3 to FIG. 8, and FIG. 16, the reflective layer 203 includes groove arrangement areas A1 and a connection area A2 located between two adjacent groove arrangement areas A1. The groove C is located in the groove arrangement area A1.

A part of the reflective layer 203 located in the groove arrangement area A1 includes at least one sub-layer, a part of the reflective layer 203 located in the connection area A2 includes at least one sub-layer, and the number of sublayers of the part of the reflective layer 203 located in the groove arrangement area A1 is greater than or equal to the number of sub-layers of the part of the reflective layer 203 located in the connection area A2.

In the embodiment of the present application, the groove arrangement area A1 not only includes the groove C, but also includes a part of the reflective layer 203 for forming the sidewall of the groove C. Therefore, on the surface of the reflective layer 203 close to the first optical film 204, the minimum distance between an edge of the groove arrangement area A1 and an edge of the groove C is greater than zero, and on the surface of the reflective layer 203 close to the base 201, the minimum distance between the edge of the groove arrangement area A1 and the edge of the groove C is greater than zero.

Here, the value of the minimum distance, between the edge of the groove arrangement area A1 and the edge of the groove C, on the surface of the reflective layer 203 close to the first optical film 204 is not limited, which is determined according to the design of products.

Here, the value of the minimum distance, between the edge of the groove arrangement area A1 and the edge of the groove C, on the surface of the reflective layer 203 close to the base 201 is not limited, which is determined according to the design of products.

In an exemplary embodiment, as shown in FIG. 3, a part of the reflective layer 203 located in the groove arrangement area A1 includes a sub-layer, and a part of the reflective layer 203 located in the connection area A2 includes a sub-layer.

In an exemplary embodiment, as shown in FIG. 6, the part of the reflective layer 203 located in the groove arrangement area A1 includes multiple sub-layers, for example three sub-layers, and the part of the reflective layer 203 located in the connection area A2 includes multiple sub-layers, for example three sub-layers.

Figure 5:
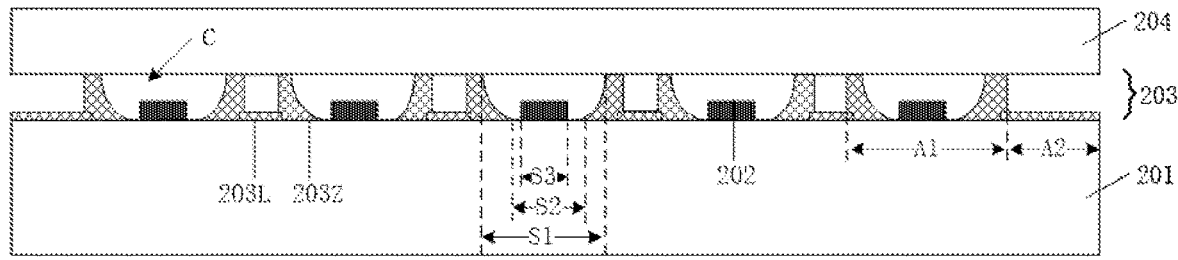
FIG. 5 is a structural schematic diagram illustrating a light emitting panels provided by another embodiment of the present application.

In an exemplary embodiment, as shown in FIG. 4 and FIG. 5, the part of the reflective layer 203 located in the groove arrangement area A1 includes multiple sub-layers (not shown in the drawings), and the part of the reflective layer 203 located in the connection area A2 includes one sub-layer.

In the embodiment of this application, a part of the reflective layer 203 located in the groove arrangement area A1 includes at least one sub-layer, a part of the reflective layer 203 located in the connection area A2 includes at least one sub-layer, and the number of sub-layers of the part of the reflective layer 203 located in the groove arrangement area A1 is greater than or equal to the number of sub-layers of the part of the reflective layer 203 located in the connection area A2. In this way, the part of the reflective layer 203 located in the groove arrangement area A1 can support the first optical film 204 and ensure the improvement of light utilization efficiency while reducing the amount of material used in the part of the reflective layer 203 located in the connection area A2, thereby reducing costs.

In some embodiments of the present application, as shown in FIG. 3 to FIG. 8, in a direction perpendicular to a plane where the base 201 is located, the thickness of the part of the reflective layer 203 located in the groove arrangement area A1 is greater than or equal to the thickness of the part of the reflective layer 203 located in the connection area A2.

In an exemplary embodiment, as shown in FIG. 3, FIG. 6 to FIG. 8, the thickness, in the direction perpendicular to the plane where the base 201 is located, of the part of the reflective layer 203 located in the groove arrangement area A1 is equal to the thickness, in the direction perpendicular to the plane where the base 201 is located, of the part of the reflective layer 203 located in the connection area A2.

In an exemplary embodiment, as shown in FIG. 4 and FIG. 5, the thickness, in the direction perpendicular to the plane where the base 201 is located, of the part of the reflective layer 203 located in the groove arrangement area A1 is greater than the thickness, in the direction perpendicular to the plane where the base 201 is located, of the part of the reflective layer 203 located in the connection area A2.

In the embodiment of the present application, the part of the reflective layer 203 located in the groove arrangement area A1 include at least one sub-layer, and the part of the reflective layer 203 located in the connection area A2 includes at least one sub-layer, the thickness, in the direction perpendicular to the plane where the base 201 is located, of the part of the reflective layer 203 located in the groove arrangement area A1 is greater than or equal to the thickness, in the direction perpendicular to the plane where the base 201 is located, of the part of the reflective layer 203 located in the connection area A2. In this way, the part of the reflective layer 203 located in the groove arrangement area A1 can support the first optical film 204 and ensure the improvement of light utilization efficiency while reducing the amount of material used in the part of the reflective layer 203 located in the connection area A2, thereby reducing costs.

In some embodiments of the present application, as shown in FIG. 3 to FIG. 8, the first optical film 204 at least is in direct contact with the part of the reflective layer 203 located in the groove arrangement area A1.

In an exemplary embodiment, as shown in FIG. 4 and FIG. 5, the first optical film 204 is in direct contact with the part of the reflective layer 203 located in the groove arrangement area A1.

In exemplary embodiments, as shown in FIG. 3, FIG. 6 to FIG. 8, the first optical film 204 is in direct contact with the part of the reflective layer 203 located in the groove arrangement area A1, and the first optical film is also in direct contact with the part of the reflective layer 203 located in the connection area A2.

In some embodiments of the present application, as shown in FIG. 3, FIG. 6 to FIG. 8, the thickness, in the direction perpendicular to the plane where the base 201 is located, of the part of the reflective layer 203 located in the groove arrangement area A1 is equal to the thickness, in the direction perpendicular to the plane where the base 201 is located, of the part of the reflective layer 203 located in the connection area A2; the first optical film 204 is in direct contact with the part of the reflective layer 203 located in the groove arrangement area A1 and the part of the reflective layer 203 located in the connection area A2.

In the embodiment of the present application, the thickness, in the direction perpendicular to the plane where the base 201 is located, of the part of the reflective layer 203 located in the groove arrangement area A1 is equal to the thickness, in the direction perpendicular to the plane where the base 201 is located, of the part of the reflective layer 203 located in the connection area A2, the first optical film 204 is in direct contact with the part of the reflective layer 203 located in the groove arrangement area A1 and the part of the reflective layer 203 located in the connection area A2. In this way, the part of the reflective layer 203 located in the groove arrangement area A1 can support the first optical film 204, and the part of the reflective layer 203 located in the connection area A2 can also support the first optical film 204, so that the structural stability of the product is improved while the light extraction efficiency of the light emitting panel is improved.

In some embodiments of the present application, as shown in FIG. 4 and FIG. 5, the thickness, in the direction perpendicular to the plane where the base 201 is located, of the part of the reflective layer 203 located in the groove arrangement area A1 is greater than the thickness, in the direction perpendicular to the plane where the base 201 is located, of the part of the reflective layer 203 located in the connection area A2.

The first optical film 204 is in direct contact with the part of the reflective layer 203 located in the groove arrangement area A1, and there is a gap between the first optical film 204 and the part of the reflective layer 203 located in the connection area A2.

Herein, there is no limitation on the size and planar shape of the gap existed between the part of the reflective layer 203 located in the connection area A2 and the first optical film 204. The size of the gap can be determined according to the thickness of the part of the reflective layer 203 located in the connection area A2, the distance between the base 201 and the first optical film 204, and the size of the part of the reflective layer 203 located in the groove arrangement area A1, and the planar shape of the gap can be determined according to the planar shape of the part of the reflective layer 203 located in the groove arrangement area A1.

It should be noted that the above planar shape refers to the shape of the orthographic projection on the base 201.

In the embodiment of the present application, the thickness, in the direction perpendicular to the plane where the base 201 is located, of the part of the reflective layer 203 located in the groove arrangement area A1 is greater than the thickness, in the direction perpendicular to the plane where the base 201 is located, of the part of the reflective layer 203 located in the connection area A2; the first optical film 204 is in direct contact with the part of the reflective layer 203 located in the groove arrangement area A1, and there is a gap between the first optical film 204 and the part of the reflective layer 203 located in the connection area A2. In this way, while the light extraction efficiency of the light emitting panel is improved, the part of the reflective layer 203 located in the groove arrangement area A1 is in direct contact with the first optical film 204 to support the first optical film 204, saving the related process of preparing support columns in the related art. Moreover, since there is a gap between the first optical film 204 and the part of the reflective layer 203 located in the connection area A2, the amount of material of the reflective layer 203 and the cost can be reduced while the part of the reflective layer 203 located in the connection area A2 reflects light.

Figure 7:
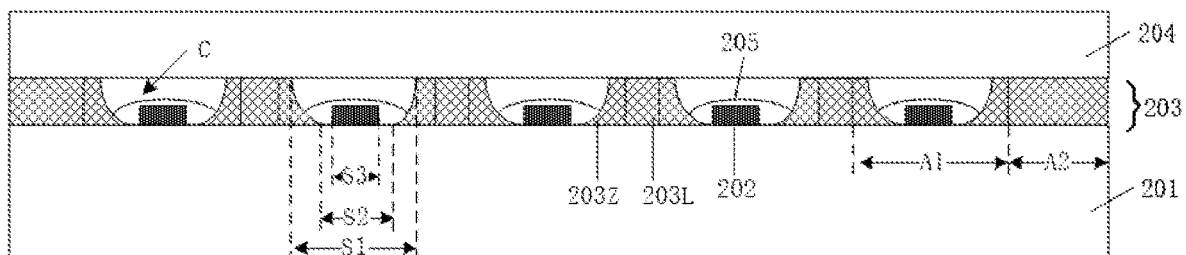
FIG. 7 is a structural schematic diagram illustrating a light emitting panels provided by another embodiment of the present application.
Figure 8:
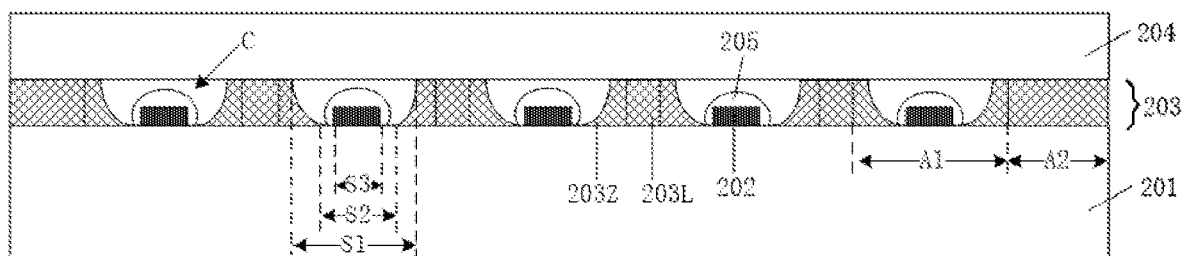
FIG. 8 is a structural schematic diagram illustrating a light emitting panels provided by another embodiment of the present application.

In some embodiments of the present application, as shown in FIG. 6 to FIG. 8, the part of the reflective layer 203 located in the groove arrangement area A1 includes the groove C and a supporting portion 203Z surrounding the groove C, and the part of the reflective layer 203 located in the connection area A2 includes a connection portion 203L.

The supporting portion 203Z is configured to support the first optical film 204, the sidewall of the groove C is configured to reflect and converge the light emitted by the device 202, and the connection portion 203L is configured to reflect the light into the first optical film 204.

In an exemplary embodiment, the supporting portion 203Z surrounding the groove C has a symmetrical structure. For example, the supporting portion 203Z surrounding the groove C is a mirror symmetrical structure.

In practical applications, for the light emitting panels shown in FIG. 4 and FIG. 5, the part of the reflective layer 203 located in the connection area A2 cannot support the first optical film 204 due to the gap between the part of the reflective layer 203 located in the connection area A2 and the first optical film 204. In order to improve the supporting effect of the part of the reflective layer 203 located in the groove arrangement area A1 on the first optical film 204, it is necessary to properly limit the size of the part of the reflective layer 203 located in the groove arrangement area A1 according to the gravity of the first optical film 204 and other film layers on the first optical film 204.

Taking the structure shown in FIG. 4 as an example, how to determine the size of the part of the reflective layer 203 located in the groove arrangement area A1 (i.e., the size of d2 in FIG. 4) will be described.

The orthographic projection, on the base 201, of the outer contour of the support portion 203Z surrounding the groove C on the side being in contact with the first optical film 204 is a circle with a radius R; the orthographic projection, on the base 201, of the inner contour of the support portion 203Z surrounding the groove C on the side being in contact with the first optical film 204 is a circle with a radius r. In this case, d2=R−r. Assuming that the total pressure on the supporting portion 203Z caused by the first optical film 204 and other film layers on the first optical film 204 is 'F', and the number of devices in the light emitting panel is 'a', the pressure on the supporting portion 203Z surrounding a single groove C is F/a, denoted as 'f'; if the compressive strength of the material selected for the supporting portion 203Z is P, then $f/\pi(R-r)^2 \le P$, thus obtaining the numerical range of d2:

$$d2 \ge \sqrt{\frac{f}{p\pi}} \circ$$

In some embodiments of the present application, as shown in FIG. 4, the outer contour of the orthographic projection of the supporting portion 203Z on the base 201 is connected to the outer contour of the orthographic projection of the connection portion 203L on the base 201.

Alternatively, as shown in FIG. 5, the orthographic projection of the supporting portion 203Z on the base 201 covers a partial area of the orthographic projection of the connection portion 203L on the base 201.

In some embodiments of the present application, as shown in FIG. 7 or FIG. 8, the light emitting panel also includes at least one light extraction structure 205. The light extraction structure 205 is located in the groove C, and arranged to cover the device 202. There is a gap between the light extraction structure 205 and the first optical film 204.

In an exemplary embodiment, when the device 202 is a light emitting device, the light extraction structure 205 can further improve the light extraction efficiency of the light emitting device, thereby improving the light efficiency; when the device 202 is a drive chip or other microchips, the light extraction structure 205 can protect the device 202 and improve the reliability and stability of the product.

In an exemplary embodiment, as shown in FIG. 7, the orthographic projection of the light extraction structure 205 on the base 201 overlaps with the orthographic projection of the supporting portion 203Z surrounding the groove C on the base 201, and the light extraction structure 205 covers the sidewall of the groove C. The supporting portion 203Z forms a sidewall of the groove C.

In an exemplary embodiment, as shown in FIG. 8, the orthographic projection of the light extraction structure 205 on the base 201 and the orthographic projection of the supporting portion 203Z surrounding the groove C on the base 201 do not overlap with each other.

Exemplarily, as shown in FIG. 8, the contour of the orthographic projection of the light extraction structure 205 on the base 201 is connected to the contour of the orthographic projection of the supporting portion 203Z surrounding the groove C on the base 201.

Exemplarily, there is a gap between the contour of the orthographic projection of the light extraction structure 205 on the base 201 and the contour of the orthographic projection of the supporting portion 203Z surrounding the groove C on the base 201.

In some embodiments of the present application, the sidewall of the groove C includes a flat surface, an arc surface or a combination of the flat surface and the arc surface.

Exemplarily, the sidewall of the groove C includes four flat surfaces.

Exemplarily, the sidewall of the groove C includes one arc surface.

Exemplarily, the sidewall of the groove C includes two flat surfaces and two arc surfaces.

In some embodiments of the present application, the material of the supporting portion 203Z includes a photo-curable material with a reflective function, and the material of the connection portion 203L includes one of the photo-curable material with the reflective function, reflective sheet, white ink, and silicon-based white glue.

An embodiment of the present application provides a light emitting apparatus including the light emitting panel as described above.

In an exemplary embodiment, the light emitting apparatus may further include a circuit board. The driving circuit in the base 201 is electrically connected to the device 202 and the circuit board respectively. The circuit board may be a flexible circuit board (FPC) or a printed circuit board (PCB) or a programmable logic array (FPGA).

The above light emitting device is a Mini/Micro LED light-emitting device.

In practical applications, according to different types of light emitting devices, the above light emitting apparatus can be used as a backlight apparatus, or can also be used as a display apparatus. Specifically, if the plurality of light emitting devices in the light emitting apparatus are all light emitting devices that emit blue light, the above-mentioned light emitting apparatus can be used as a backlight apparatus. If the plurality of light emitting devices in the light emitting apparatus include three types of light emitting devices that emit red light, green light and blue light, the light emitting apparatus can be used as a display apparatus.

Figure 11:
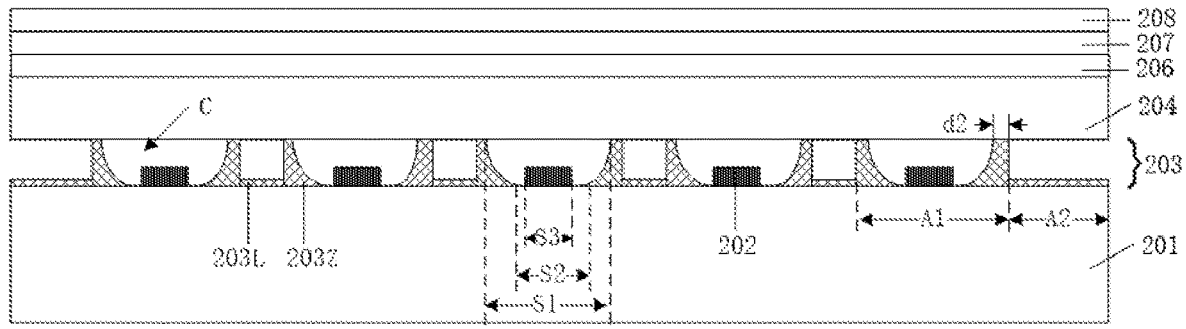
FIG. 11 is a schematic structural diagram illustrating a light emitting apparatus provided by an embodiment of the present application.

In an exemplary embodiment, when the light emitting apparatus is used as a backlight apparatus, the backlight apparatus may also include a second optical film, a third optical film, etc., for example the quantum dot film 206, the diffusion sheet 207 and the composite film 208 shown in FIG. 11. Among them, the first optical film 204 (such as a diffusion plate) and the diffusion sheet 207 are mainly used to eliminate lamp shadows and improve the uniformity of the picture, and the composite film 208 is mainly used to increase brightness. When the light emitting device emits blue light, the quantum dot film 206 can convert blue light into white light through excitation of blue light.

In the embodiment of the present application, the reflective layer 203 is provided with a plurality of grooves C arranged in an array, and the device 202 is arranged in the groove C, due to the reflection effect of the side wall of the groove C, it is possible to avoid the first light loss in the related art caused by the part of the light marked as ① in FIG. 2 because this part of light cannot be injected into the first optical film 204. Further, since at least partial regions of the reflective layer 203 provided by the embodiment of the present application are in direct contact with the first optical film 204, the situation in the related art that the part of the light marked as ② in FIG. 2 is reflected to the reflective layer 104 by the diffusion layer 106, reflected by the reflective layer 104 and fails to enter the diffusion film 106 is avoided, that is, the second light loss is significantly reduced. In this way, the light emitting panel provided by the embodiments of the present application can significantly reduce the light loss during the propagation of light, thereby improving the utilization rate of light. The device 202 includes at least a light emitting device.

Figure 12:
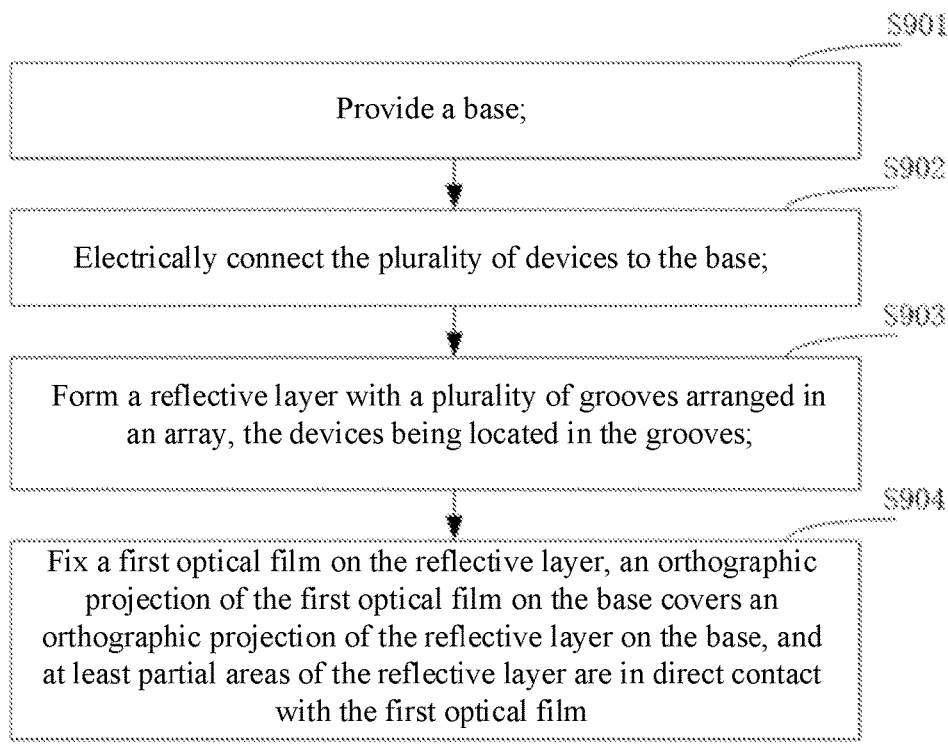
FIG. 12 is a flow chart of a method for preparing a light emitting panel provided by an embodiment of the present application.

An embodiment of the present application provides a method for preparing a light emitting panel as described above. As shown in FIG. 12, the method includes steps below.

Figure 13:
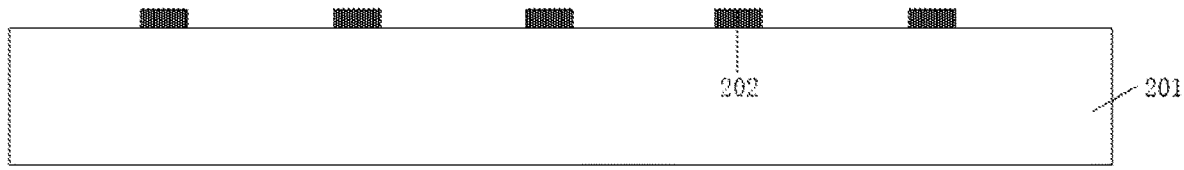
FIG. 13 to FIG. 15 are diagrams illustrating intermediate structures during the preparation process of the light emitting panel provided by the embodiment of the present application.

At S901, a base 201 as shown in FIG. 13 is provided.

The base 201 may include a substrate and a conductive pattern on the substrate. The conductive pattern is configured to form connection traces and a driving circuit. Each device 202 is electrically connected to the driving circuit in the base 201.

At S902, the plurality of devices 202 are electrically connected to the base 201.

In an exemplary embodiment, the devices 202 include at least a light emitting device, and may also include any one of a sensor device, a micro-drive chip or other types of devices. It can be understood that the number of various types of devices is different, or the density of the array arrangement of different types of devices is different.

The light emitting device may be a Mini Light Emitting Diode (English abbreviation is Mini LED) or a micro light emitting diode (English abbreviation is Micro LED), which is not limited herein.

Exemplarily, the devices 202 may all be Mini LEDs or micro-LEDs emitting blue light, or the devices 202 may include three types of LEDs or micro-LED emitting red, green and blue light.

Figure 14:
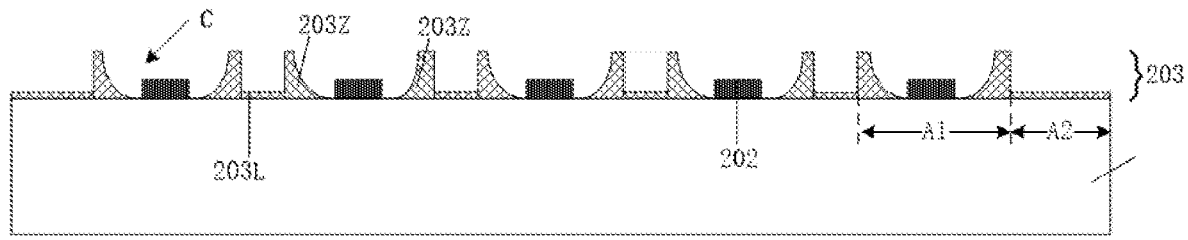

At S903, a reflective layer 203 as shown in FIG. 14 is formed, the reflective layer 203 including a plurality of grooves C arranged in an array, and the devices 202 being located in the grooves C.

The shape of the orthographic projection of the groove C on the base 201 is not limited here. Exemplarily, the shape of the orthographic projection of the outer contour of the groove C on the base 201 may be a circle, an ellipse or a polygon. The shape of the orthographic projection of the inner contour of the groove C on the base 201 may be a circle, an ellipse or a polygon.

Herein, there is no limitation on the cross sectional shape of the groove C in a direction perpendicular to a plane where the base 201 is located. Exemplarily, as shown in FIG. 3 and FIG. 4, the cross-sectional shape of the groove C in the direction perpendicular to the plane where the base 201 is located includes a semicircle or a semiellipse. Alternatively, as shown in FIG. 6, the cross-sectional shape of the groove C along the direction perpendicular to the plane where the base 201 is located includes a trapezoid.

Herein, there is no limitation on the size of the groove C in a direction parallel to the plane where the base 201 is located, which can be determined according to the size of the device 202 and the external force that the reflective layer 203 needs to bear.

Figure 15:
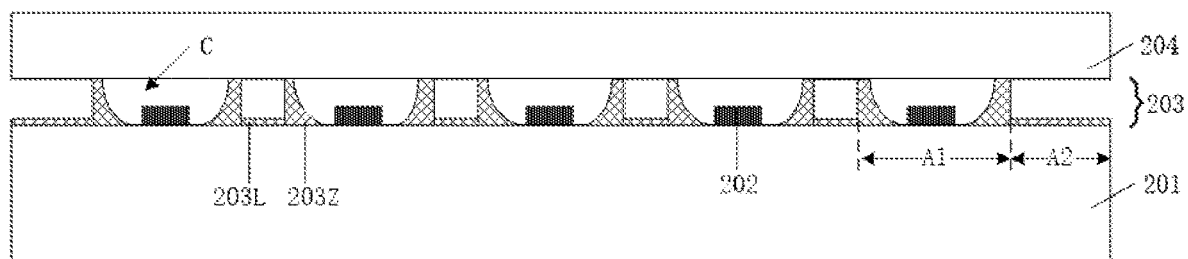

At S904, a first optical film 204 shown in FIG. 15 is fixed on the reflective layer 203, the orthographic projection of the first optical film 204 on the base 201 covers the orthographic projection of the reflective layer 203 on the base 201, and at least partial regions of the reflective layer 203 are in direct contact with the first optical film 204.

In the embodiment of the present application, on the one hand, the reflective layer 203 prepared by the above method can reflect light; on the other hand, the reflective layer 203 can also support the first optical film 204.

In the embodiments of the present application, in the light emitting panel prepared by the above preparation method, the reflective layer 203 is provided with a plurality of grooves C arranged in an array, and the device 202 is arranged in the groove C, due to the reflection effect of the side wall of the groove C, it is possible to avoid the first light loss in the related art caused by the part of the light marked as ① in FIG. 2 because this part of light cannot be injected into the first optical film 204. Further, since at least partial regions of the reflective layer 203 provided by the embodiment of the present application are in direct contact with the first optical film 204, the situation in the related art that the part of the light marked as ② in FIG. 2 is reflected to the reflective layer 104 by the diffusion layer 106, reflected by the reflective layer 104 and fails to enter the diffusion film 106 is avoided, that is, the second light loss is significantly reduced. In this way, the light emitting panel provided by the embodiments of the present application can significantly reduce the light loss during the propagation of light, thereby improving the utilization rate of light. The device 202 includes at least a light emitting device.

In some embodiments of the present application, the reflective layer 203 includes a supporting portion 203Z and a connection portion 203L. Step S903, in which a reflective layer is formed, the reflective layer including a plurality of grooves arranged in an array, and the devices being located in the grooves, includes steps below.

At S9031, a printing process is used to simultaneously form the supporting portions 203Z and the grooves C. The supporting portion 203Z surrounds the groove C, and is in direct contact with the first optical film 204.

The above printing process may include a 3D printing process. The specific steps of the 3D printing process are not limited here, and may be determined according to actual conditions.

The material of the supporting portion 203Z includes photo-curable materials.

At S9032, the connection portions 203L are formed. The outer contour of the orthographic projection of the supporting portion 203Z on the base 201 is connected to the outer contour of the orthographic projection of the connection portion 203L on the base 201. Alternatively, the orthographic projection of the supporting portion 203Z on the base 201 covers a partial area of the orthographic projection of the connection portion 203L on the base 201.

According to the light emitting panel prepared by the above preparation method provided by the embodiments of the present application, firstly, the light efficiency can be greatly improved, and the utilization rate of the light source is improved; secondly, the grooving precision is high, and a groove C with a small size can be prepared to receive the device 202, so as to maximize the area covered by the reflective layer on the base, and there is no need for subsequent glue replenishment in related art; thirdly, the drawbacks in the related art that the accurate alignment cannot be achieved through other preparation processes and the devices 202 are easily covered are solved; fourthly, by configuring at least partial regions of the reflective layer 203 to be in direct contact with the first optical film 204, the first optical film 204 can be supported, thereby eliminating the need for a subsequent manufacturing process of a support column, thereby reducing costs.

It should be noted, when preparing the reflective layer in the related art, as shown in FIG. 2, limited by the preparation process, in order to prevent the reflective layer from covering the light emitting devices, the gap between the sidewall of the opening in the reflective layer and the light emitting device is relatively large. In order to effectively improve the reflectivity, after the reflective layer is formed, a dispensing process is generally used to fill the area without the reflective layer around the light emitting device.

The preparation method of the light emitting panel will be described below in conjunction with the specific structure.

Figure 16:
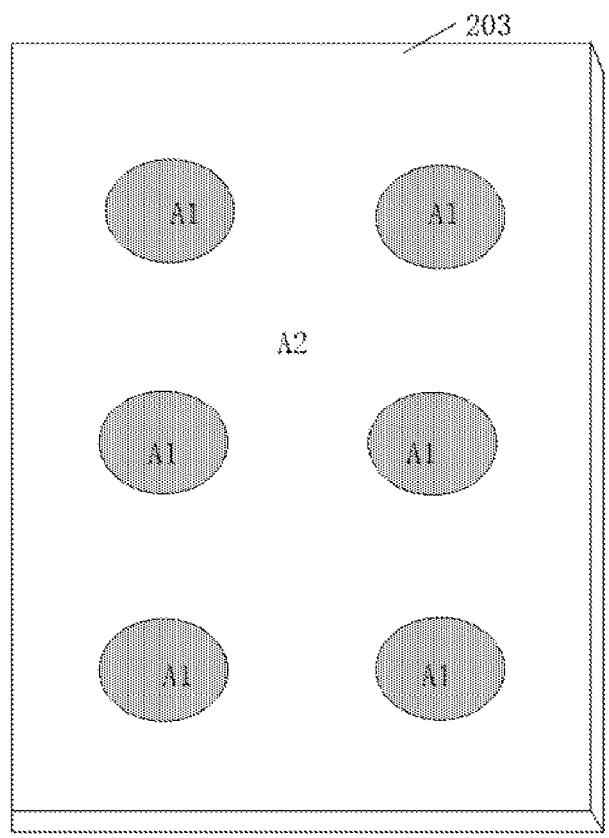
FIG. 16 is a schematic diagram illustrating divisions of the reflective layer provided by the embodiment of the present application.

Firstly, the structure shown in FIG. 6 is taken as an example. In the case that the part of the reflective layer 203 located in the groove arrangement area A1 includes multiple sub-layers (that is, the supporting portion 203Z includes multiple sub-layers), and the part of the reflective layer 203 located in the connection area A2 includes multiple sub-layers (that is, the connection portion 203L includes multiple sub-layers), on the structure shown in FIG. 13, the 3D printing process is adopted, the discharge volume of the nozzle of the printing device is set to be small, and the multi-layer supporting portion 203Z is printed around the device 202 (in the groove arrangement area A1 shown in FIG. 16), so as to obtain the groove C and the supporting portion 203Z at the same time, wherein multiple sub-layers can be printed layer by layer from bottom to top; then the discharge volume of the nozzle of the printing device is set to be larger, and the connection portion 203L between two adjacent supporting portions 203Z is printed in the connection area A2 as shown in FIG. 16. It should be noted that, since the supporting portion 203Z surrounds the device 202, in order to ensure the printing accuracy and avoid printing on the device 202, the discharge volume of the nozzle of the printing device is relatively small when the supporting portion 203Z is printed, and the specific discharge volume can be determined according to the characteristics of the used material and equipment parameters.

Secondly, the structure shown in FIG. 4 or FIG. 5 is taken as an example, in the case that the part of the reflective layer 203 located in the groove arrangement area A1 includes multiple sub-layers (that is, the supporting portion 203Z includes multiple sub-layers), and the part of the reflective layer 203 located in the connection area A2 includes one sub-layer (that is, the connection portion 203L includes one sub-layer), on the structure shown in FIG. 13, the 3D printing technology is adopted, the connection portion 203L with one sub-layer is first printed in the connection area A2 as shown in FIG. 16, and then the supporting portion 203Z with multiple sublayers is printed in the groove arrangement area A1, so as to obtain the groove C and the supporting portion 203Z at the same time; the outer contour of the orthographic projection of the supporting portion 203Z on the base 201 is connected to the outer contour of the orthographic projection of the connection portion 203L on the base 201; alternatively, the orthographic projection of the supporting portion 203Z on the base 201 covers a partial area of the orthographic projection of the connection portion 203L on the base 201.

Thirdly, in the case that the part of the reflective layer 203 located in the groove arrangement area A1 includes multiple sub-layers (that is, the supporting portion 203Z includes multiple sub-layers), and the part of the reflective layer 203 located in the connection area A2 includes one sub-layer (that is, the connection portion 203L includes one sub-layer), on the structure shown in FIG. 13, a reflective sheet is coated on the connection area A2 as shown in FIG. 16 and used as the connection portion 203L by using a bonding process; then a support portion 203Z with multiple sub-layers are printed in the groove arrangement area A1 by using a printing process, so as to obtain the groove C and the supporting portion 203Z at the same time; the outer contour of the orthographic projection of the supporting portion 203Z on the base 201 is connected to the outer contour of the orthographic projection of the connection portion 203L on the base 201; alternatively, the orthographic projection of the supporting portion 203Z on the base 201 covers a partial area of the orthographic projection of the connection portion 203L on the base 201.

For the specific process of printing, reference may be made to related technologies, which are not specifically limited here.

The above is only specific embodiments of the application, but the scope of protection of the application is not limited thereto. Those skilled in the art can easily think of changes or replacements within the scope of the technology disclosed in this application, which should be covered within the scope of protection of the application. Therefore, the protection scope of the present application should be determined by the protection scope of the claims.

The invention claimed is:

1. A light emitting panel, comprising:
a base;
a reflective layer located on a side of the base, wherein the reflective layer comprises a plurality of grooves arranged in an array;
a plurality of devices located in the grooves and electrically connected to the base; and
a first optical film located on a side of the reflective layer facing away from the base, wherein an orthographic projection of the first optical film on the base covers an orthographic projection of the reflective layer on the base, and at least partial areas of the reflective layer are in direct contact with the first optical film;
wherein orthographic projections of outer contours of every two adjacent grooves on the base are separated from each other; the reflective layer comprises groove arrangement areas and a connection area between two adjacent groove arrangement areas, and the groove is located in the groove arrangement area;
wherein the part of the reflective layer located in the groove arrangement area comprises the groove and a supporting portion surrounding the groove, and the part of the reflective layer located in the connection area comprises a connection portion; the supporting portion is configured to support the first optical film, a sidewall of the groove is configured to reflect and converge light emitted by the device, and the connection portion is configured to reflect the light into the first optical film.

2. The light emitting panel according to claim 1, wherein each of the grooves comprises a bottom close to the base and an opening close to the first optical film;
wherein an orthographic projection of an outer contour of the bottom on the base is located within an orthographic projection of an outer contour of the opening on the base, and an orthographic projection of an outer contour of the device on the base is located within the orthographic projection of the outer contour of the bottom on the base.

3. The light emitting panel according to claim 1,
wherein the part of the reflective layer located in the groove arrangement area comprises at least one sub-layer, and the part of the reflective layer located in the connection area comprises at least one sub-layer, wherein a number of sub-layers of the part of the reflective layer located in the groove arrangement area is greater than or equal to a number of sub-layers of the part of the reflective layer located in the connection area.

4. The light emitting panel according to claim 3, wherein a thickness of the part of the reflective layer located in the groove arrangement area in a direction perpendicular to a plane where the base is located is greater than or equal to a thickness of the part of the reflective layer located in the connection area in the direction perpendicular to the plane where the base is located.

5. The light emitting panel according to claim 4, wherein the first optical film is at least in direct contact with the part of the reflective layer located in the groove arrangement area.

6. The light emitting panel according to claim 5, wherein the thickness of the part of the reflective layer located in the groove arrangement area in the direction perpendicular to the plane where the base is located is equal to the thickness of the part of the reflective layer located in the connection area in the direction perpendicular to the plane where the base is located;
the first optical film is in direct contact with both of the part of the reflective layer located in the groove arrangement area and the part of the reflective layer located in the connection area.

7. The light emitting panel according to claim 5, wherein the thickness of the part of the reflective layer located in the groove arrangement area in the direction perpendicular to the plane where the base is located is greater than the thickness of the part of the reflective layer located in the connection area in the direction perpendicular to the plane where the base is located;
the first optical film is in direct contact with the part of the reflective layer located in the groove arrangement area, and a gap exists between the first optical film and the part of the reflective layer located in the connection area.

8. The light emitting panel according to claim 1, wherein an outer contour of the orthographic projection of the supporting portion on the base is contact with an outer contour of the orthographic projection of the connection portion on the base; or
the orthographic projection of the supporting portion on the base covers a partial area of the orthographic projection of the connection portion on the base.

9. The light emitting panel according to claim 1, further comprising at least one light extraction structure, wherein the light extraction structure is located in the groove and covers the device, and a gap exists between the light extraction structure and the first optical film.

10. The light emitting panel according to claim 1, wherein a sidewall of the groove comprises a flat surface, an arc surface or a combination of the flat surface and the arc surface.

11. The light emitting panel according to claim 1, wherein a material of the supporting portion comprises a photocurable material with a reflective function, and the material of the connection portion comprises one of the photocurable material with the reflective function, a reflective sheet, white ink, and silicon-based white glue.

12. A method for preparing a light emitting panel according to claim 1, comprising:
providing the base;
electrically connecting the plurality of devices to the base;
forming the reflective layer with the plurality of grooves arranged in an array, the devices being located in the grooves;
fixing the first optical film on the reflective layer, wherein the orthographic projection of the first optical film on the base covers the orthographic projection of the reflective layer on the base, and at least partial areas of the reflective layer are in direct contact with the first optical film;
wherein the reflective layer comprises a supporting portion and a connection portion, wherein the forming the reflective layer with the plurality of grooves arranged in an array, the devices being located in the grooves comprises:
forming the supporting portion and the groove simultaneously through a printing process, wherein the supporting portion surrounds the groove and is in direct contact with the first optical film;
forming the connection portion, wherein an outer contour of the orthographic projection of the supporting portion on the base is contact with an outer contour of the orthographic projection of the connection portion on the base; or, the orthographic projection of the supporting portion on the base covers a partial area of the orthographic projection of the connection portion on the base.

13. A light emitting apparatus comprising a light emitting panel,
wherein the light emitting panel comprises:
a base;
a reflective layer located on a side of the base, wherein the reflective layer comprises a plurality of grooves arranged in an array;
a plurality of devices located in the grooves and electrically connected to the base; and
a first optical film located on a side of the reflective layer facing away from the base, wherein an orthographic projection of the first optical film on the base covers an orthographic projection of the reflective layer on the base, and at least partial areas of the reflective layer are in direct contact with the first optical film;
wherein orthographic projections of outer contours of every two adjacent grooves on the base are separated from each other; the reflective layer comprises groove arrangement areas and a connection area between two adjacent groove arrangement areas, and the groove is located in the groove arrangement area;
wherein the part of the reflective layer located in the groove arrangement area comprises the groove and a supporting portion surrounding the groove, and the part of the reflective layer located in the connection area comprises a connection portion; the supporting portion is configured to support the first optical film, a sidewall of the groove is configured to reflect and converge light emitted by the device, and the connection portion is configured to reflect the light into the first optical film.

* * * * *